United States Patent [19]
Stark

[11] Patent Number: 5,938,787
[45] Date of Patent: Aug. 17, 1999

[54] COMMUNICATIONS SYSTEMS AND METHODS EMPLOYING CODE RATE PARTITIONING WITH NONORTHOGONAL MODULATION

[75] Inventor: Wayne E. Stark, Chapel Hill, N.C.

[73] Assignee: Ericsson Inc., Research Triangle Park, N.C.

[21] Appl. No.: 08/826,484

[22] Filed: Mar. 27, 1997

[51] Int. Cl.$^6$ .................................................. H03M 13/00
[52] U.S. Cl. ........................ 714/755; 714/746; 714/708; 714/758; 714/750; 714/752; 714/704; 714/754; 714/781; 370/321; 370/326; 370/350; 371/30; 371/5.5; 371/37.7; 371/34.1; 371/37.01; 371/5.1; 371/37.03; 371/37.07; 371/43
[58] Field of Search .......................... 371/37.4, 30, 37.7, 371/34.1, 5.5, 37.01, 5.1, 43, 37.03, 37.07; 370/321, 326, 350

[56] References Cited

U.S. PATENT DOCUMENTS

| | | | |
|---|---|---|---|
| 4,446,530 | 5/1984 | Tsuboka ................................. | 364/725 |
| 4,894,844 | 1/1990 | Forney, Jr. .............................. | 375/269 |
| 4,939,555 | 7/1990 | Calderbank et al. ................... | 375/286 |
| 5,561,618 | 10/1996 | Dehesh .............................. | 364/725.01 |
| 5,577,053 | 11/1996 | Dent ...................................... | 371/37.4 |
| 5,594,742 | 1/1997 | Hemmati .............................. | 371/43.4 |
| 5,659,578 | 8/1997 | Alamouti et al. ....................... | 375/261 |

FOREIGN PATENT DOCUMENTS

| | | |
|---|---|---|
| 0 663 775 A2 | 7/1995 | European Pat. Off. . |
| WO 95/22859 | 8/1995 | WIPO . |
| WO 96/05668 | 2/1996 | WIPO . |

OTHER PUBLICATIONS

International Search Report, PCT/US98/05844, Aug. 24, 1998.

Henkel *"Phase-Invariant Coded Phase Shift Keying Using Reed-Muller Codes"*, AEU Archiv fur Elektronik und Ubertragungstechnik, vol. 46, No. 3, May 1992, pp. 125–130.

Atkin et al., "Multiple Laser Diodes Non-Orthogonal Poer Combining", IEEE, pp. 113–124, May 1989.

Cheng et al., *"Performance of Trellis Coded Direct-Sequence Spread-Spectrum Multiple-Access With Noncoherent Reception in a Fading Environment"*, The Seventh IEEE International Symposium on Personal, Indoor and Mobile Radio Communications, PIMRC '96: Taipei International Convention Center, Taipei, Taiwan, ROC, Oct. 15–18, 1996, pp. 1125–1130.

MacWilliams et al, *"The Theory of Error-Correcting Codes"*, North-Holland Publishing Company, 1977, pp. 73–78, 406–479.

*Primary Examiner*—Reba I. Elmore
*Assistant Examiner*—McDieunel Marc
*Attorney, Agent, or Firm*—Myers Bigel Sibley & Sajovec

[57] ABSTRACT

Information is processed to produce a plurality of information symbols. The plurality of information symbols are encoded according to a concatenation of an error correction code and a nonorthogonal modulation code to produce a modulated communications signal. The modulated communications signal is communicated over a communications medium, and process the communicated modulated communications signal is processed to produce information. Preferably, the information symbols are encoded according to an error correction code, preferably a convolutional code, to produce a plurality of coded symbols. The plurality of coded symbols are preferably interleaved to produce a plurality of interleaved coded symbols. The interleaved coded symbols are then modulated according to a nonorthogonal code to produce the modulated communications signal. Preferably, the coded symbols are modulated according to a proper subset of a one of a Nordstrom-Robinson code, a Reed-Muller code, or a Kerdock code, the proper subset being operable to produce a modulated communications signal from a signal set such that the communications signal noncoherently demodulates to produce a unique output for each signal in the signal set, and the communications signal processing includes noncoherent demodulating to noncoherently demodulate the communicated modulated communications signal.

34 Claims, 5 Drawing Sheets

COMMUNICATIONS SYSTEMS AND METHODS EMPLOYING CODE RATE PARTITIONING WITH NONORTHOGONAL MODULATION

FIELD OF THE INVENTION

The present invention relates to communications systems and methods, in particular, to coding systems and methods in communications systems.

BACKGROUND OF THE INVENTION

In many communications systems, for example, wireless communications systems such as mobile satellite radiotelephone systems, it is generally desirable to use as little signal power as necessary to communicate signals. Toward this end, many communications systems utilize error correction coding to improve signal-to-noise ratio without requiring an increase in signal power. As illustrated in FIG. 1, in a typical wireless communications system, information represented by information symbols 105 is first encoded according to an error control code, for example, in a convolutional encoder 110. The coded symbols 115 output from the convolutional coder 110 are then typically interleaved in an interleaver 120, which reorders the coded symbols 115 to produce a plurality of interleaved coded symbols 125. The interleaved coded symbols 125 are then typically orthogonally modulated by an orthogonal modulator 130 to produce a communications signal 135 which is then communicated over a communications medium 140. An orthogonal modulator 130 is typically employed because the orthogonally modulated communications signal 135 can be demodulated in a noncoherent fashion at a receiver.

The convolutional encoder 110 and the orthogonal demodulator 130 produce an overall code rate and minimum distance for the communications signal 135. The convolutional encoder 110 typically employs a rate k/n convolutional code, i.e., a code which produces n coded symbols 115 for each k information symbols 105 input into the encoder 110, and generally has a minimum Hamming distance $d_{1,min}$ associated therewith. The orthogonal modulator 130 typically employs a set of p orthogonal block modulation vectors of length l for input vectors of length m, producing a code rate of m/l and a minimum distance of $d_{2,min}$. When combined as illustrated in FIG. 1, the convolutional encoder 110 and the orthogonal modulator 130 produce an overall code rate of k/n * m/l and a minimum distance of $d_{1,min}$ * $d_{2,min}$.

Although techniques exist for improving the error-correcting performance of a conventional combination of a convolutional encoder and an orthogonal modulator, for example, lowering the rate of the convolutional encoder 110 or the orthogonal modulator 130 to provide greater redundancy, these techniques can result in lower efficiency and greater complexity in receiver design. Due to bandwidth and power constraints, there is an ever present need to provide improved signal-to-noise performance without requiring undue additional complexity in receiver design, increased signal power and decreased rate.

SUMMARY OF THE INVENTION

In light of the foregoing, it is an object of the present invention to provide error correction coding and modulation systems and methods which provide improved signal-to-noise performance.

It is another object of the present invention to provide error correction coding and modulation systems and methods which may be utilized with noncoherent demodulation techniques.

These and other objects, features and advantages are provided according to the present invention by communications systems and methods in which information symbols are encoded according to a concatenation of a error correcting code, preferably a convolutional code, and a nonorthogonal modulation code to produce a modulated communications signal representing the information symbols. The nonorthogonal modulation code preferably corresponds to one of a Nordstrom-Robinson, a Reed-Muller and a Kerdock code, representing a union of selected translations of an orthogonal code set. More preferably, the nonorthogonal modulation code represents a signal set such that when the communications signal is noncoherently demodulated, a unique output is produced for each code in the set. In this manner, less complex demodulation techniques can be employed.

The present invention stems from the recognition that a coding scheme having improved distance characteristics over a conventional concatenation of an error correcting code and an orthogonal modulation can be achieved by replacing the orthogonal modulation code with a selected nonorthogonal modulation code which represents an expansion of an orthogonal code which can be demodulated without undue complexity using modified noncoherent orthogonal demodulation techniques. By utilizing nonorthogonal modulation vectors, the present invention allows a decreased code rate to be utilized for the error correcting code while maintaining a desired overall code rate and increasing overall minimum distance.

In particular, in a communications system according to the present invention, information is processed to produce a plurality of information symbols. The plurality of information symbols are encoded according to a concatenation of an error correction code and a nonorthogonal modulation code to produce a modulated communications signal. The modulated communications signal is communicated over a communications medium, and the communicated modulated communications signal is processed to produce information. Preferably, the convolutional code is punctured to thereby provide a desired overall coding rate. More optimal partitioning between error correction encoding and modulation may thereby be provided.

Preferably, means for encoding the plurality of information symbols are encoded according to an error correction code to produce a plurality of coded symbols, and the plurality of coded symbols are modulated according to a nonorthogonal modulation code to produce a modulated communications signal. The coded symbols produced by the error correction encoding preferably are interleaved before nonorthogonal modulation. According to a preferred embodiment, the plurality of coded symbols are modulated according to a nonorthogonal modulation code representing a union of translations of a set of orthogonal code vectors according to a predetermined translation which produces one of a Nordstrom-Robinson code, a Reed-Muller code, and a Kerdock code, the predetermined translation including a plurality of vectors which map the orthogonal code to the nonorthogonal code.

Preferably, the coded symbols are modulated according to a proper subset of a nonorthogonal modulation code, the proper subset being operable to produce a modulated communications signal from a signal set such that the communications signal noncoherently demodulates to produce a unique output for each signal in the signal set. The communications signal processing preferably includes noncoherent demodulating for noncoherently demodulating the communicated modulated communications signal.

The noncoherent demodulating means preferably processes the communicated modulated communications signal to produce a plurality of received communications symbols, and translates the plurality of received communications symbols according the translation vectors which produce the nonorthogonal modulation code to produce a plurality of groups of communications symbols, a respective group corresponding to a respective one of the translation vectors of the nonorthogonal code. Each group of communications symbols may be correlated with the set of orthogonal code vectors to produce decision information for each group, and the decision information for the groups of communications symbols are combined to produce a second plurality of information symbols. Efficient demodulation of the nonorthogonally modulated communications signal is thereby provided.

BRIEF DESCRIPTION OF THE DRAWINGS

Some of the objects and advantages of the present invention having been stated, others will be more fully understood from the detailed description that follows and by reference to the accompanying drawings in which.

DETAILED DESCRIPTION OF PREFERRED EMBODIMENTS

Figure 1:
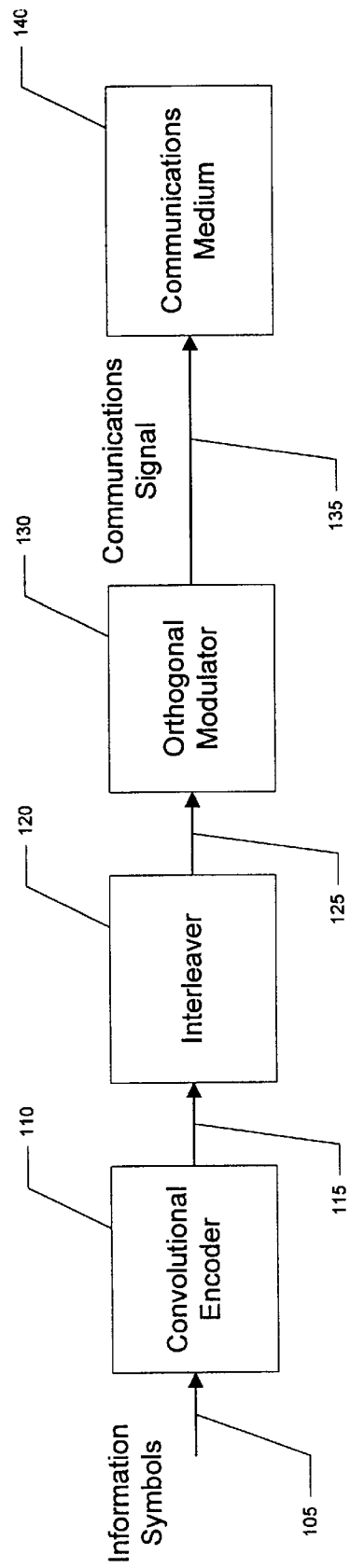
FIG. 1 is a schematic diagram illustrating a communications system according to the prior art.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements throughout.

Overview

As will be appreciated by those skilled in the art, in a typical conventional communication scheme such as the one illustrated in FIG. 1, information may be protected by an error control code, e.g., a convolutional code. For an input information sequence of binary symbols $b_i \in \{+1, -1\}$, the convolutional code produces a coded symbol sequence $\{c_j\}$ including symbols which are a function of the input sequence $b_i$. For a rate ½ convolutional code, for example, the coded bits $c_{2i}$ and $c_{2i+1}$, are some function of $b_i, \ldots, b_{i-M+1}$ where M is the memory of the code, i.e., the rate ½ code produces two coded symbols for each input information symbol.

Those skilled in the art will also understand that in addition to the rate of the code, an important measure of the performance of a code is the minimum Hamming and Euclidean distance of the code, representing a measure of the separation between two possible codewords in the code.

For example, consider a typical orthogonal modulation scheme, in which a sequence of symbols input into a modulator are mapped onto a signal set including p vectors of length p that are orthogonal, each component of the vectors being commonly known as a "chip." If $s_i=(s_{i,1}, \ldots, s_{i,p})$ for $i=1, \ldots, p$ are these vectors, with $s_{j,i} \in \{\pm 1\}$, then $$\sum_{i=1}^{p} s_{l,i}s_{m,i} = \begin{cases} p, l = m \\ 0, l \neq m \end{cases}.$$

For example, if p=16, these vectors are:

$s_1=\{+1, +1, +1, +1, +1, +1, +1, +1, +1, +1, +1, +1, +1, +1, +1, +1\}$;
$s_2=\{+1, -1, +1, -1, +1, -1, +1, -1, +1, -1, +1, -1, +1, -1, +1, -1\}$;
$s_3=\{+1, +1, -1, -1, +1, +1, -1, -1, +1, +1, -1, -1, +1, +1, -1, -1\}$;
$s_4=\{+1, -1, -1, +1, +1, -1, -1, +1, +1, -1, -1, +1, +1, -1, -1, +1\}$;
$s_5=\{+1, +1, +1, +1, -1, -1, -1, -1, +1, +1, +1, +1, -1, -1, -1, -1\}$;
$s_6=\{+1, -1, +1, -1, -1, +1, -1, +1, +1, -1, +1, -1, -1, +1, -1, +1\}$;
$s_7=\{+1, +1, -1, -1, -1, -1, +1, +1, +1, +1, -1, -1, -1, -1, +1, +1\}$;
$s_8=\{+1, -1, -1, +1, -1, +1, +1, -1, +1, -1, -1, +1, -1, +1, +1, -1\}$;
$s_9=\{+1, +1, +1, +1, +1, +1, +1, +1, -1, -1, -1, -1, -1, -1, -1, -1\}$;
$s_{10}=\{+1, -1, +1, -1, +1, -1, +1, -1, -1, +1, -1, +1, -1, +1, -1, +1\}$;
$s_{11}=\{+1, +1, -1, -1, +1, +1, -1, -1, -1, -1, +1, +1, -1, -1, +1, +1\}$;
$s_{12}=\{+1, -1, -1, +1, +1, -1, -1, +1, -1, +1, +1, -1, -1, +1, +1, -1\}$;
$s_{13}=\{+1, +1, +1, +1, -1, -1, -1, -1, -1, -1, -1, -1, +1, +1, +1, +1\}$;
$s_{14}=\{+1, -1, +1, -1, -1, +1, -1, +1, -1, +1, -1, +1, +1, -1, +1, -1\}$;
$s_{15}=\{+1, +1, -1, -1, -1, -1, +1, +1, -1, -1, +1, +1, +1, +1, -1, -1\}$; and
$s_{16}=\{+1, -1, -1, +1, -1, +1, +1, -1, -1, +1, +1, -1, +1, -1, -1, +1\}$.

The squared Euclidean distance between two distinct codewords is defined as:

$$d_{l,m}^2 = \sum_{j=1}^{p} (s_{l,i} - s_{m,i})^2$$

For orthogonal modulation vectors:

$d_{l,m}^2 = 2p$, for $l \neq m$.

For the above example in which p=16, the minimum squared Euclidean distance is thus 32.

As is well-known by those skilled in the art, an orthogonal modulation code is conventionally used in communications systems, as an orthogonally modulated signal may be demodulated in a noncoherent fashion, i.e., decision statistics for received symbols can be derived without knowing the phase of the received signal. For example, when a convolutional code with minimum Hamming distance $d_{min}$ is followed by a long interleaver and then orthogonally modulated according to an orthogonal modulation code as described above with distance 2p and rate ¼, the overall squared Euclidean distance is $2pd_{min}$. The rate of the concatenation of the convolutional code and the orthogonal modulation code in bits/chip is ¼ *1/n where 1/n is the rate of the convolutional code, e.g., for a rate ½ convolutional code, the overall rate becomes ⅛.

Increasing the size of the modulation signal set is generally desirable because using a larger modulation code set can increase the rate of communication without substantially increasing the likelihood of a decoder error or substantially degrading reliability, thus enabling the use of lower rate convolutional codes. Thus, performance of a coding scheme can be adjusted by varying the size of the signal set used for modulation and varying the rate of the convolutional code such that the overall rate of communications is the same as that provided by a conventional combination of a convolutional encoder and an orthogonal modulator. However, although a larger modulation signal set can be created including complementary codes, i.e., codes which are negatives of one another, these codes produce signals representing 180 degree phase shifts from one another, and thus produce signals which are not amenable to noncoherent demodulation. For this reason, it generally is preferable to use a proper subset of modulation vectors such that none of the modulation vectors has a complement within the subset.

According to the present invention, the original orthogonal code set is expanded by adding selected translates of the original orthogonal vectors to the modulation code set. For the example given above, the orthogonal signal set for 16 vectors can be expanded to 128 vectors by using the following translation vectors which produce a subcode of the length 16 Nordstrom-Robinson code:

$b_1$={+1, +1, +1, +1, +1, +1, +1, +1, +1, +1, +1, +1, +1, +1, +1, +1};
$b_2$={+1, +1, +1, −1, +1, +1, +1, −1, +1, +1, −1, +1, −1, −1, +1, −1};
$b_3$={+1, +1, +1, +1, +1, −1, −1, +1, +1, +1, −1, −1, +1, −1, +1, −1};
$b_4$={+1, +1, −1, +1, +1, −1, +1, +1, −1, +1, +1, +1, −1, −1, −1};
$b_5$={+1, +1, +1, +1, +1, +1, −1, −1, +1, −1, +1, −1, −1, +1, +1, −1};
$b_6$={+1, +1, +1, −1, +1, −1, −1, −1, +1, −1, −1, −1, −1, −1, −1, +1};
$b_7$={+1, +1, +1, +1, +1, −1, +1, −1, +1, −1, −1, +1, +1, +1, −1, −1}; and
$b_8$={+1, +1, +1, −1, +1, −1, +1, +1, +1, +1, +1, −1, −1, +1, −1, −1}.

The new code includes all vectors of the form:

$(s_{l,1}b_{m,1}, s_{l,2}b_{m,2}, \ldots, s_{l,16}b_{m,16})$ for l=1, ..., 16 and m=1, ..., 8, i.e., 16*8=128 code words. Those skilled in the art will appreciate that this construction is not unique, and that there may be other possible vectors $b_1, \ldots, b_8$ that will give an equivalent or identical code.

To allow for noncoherent demodulation, a subset (or subcode) is preferably selected for use in nonorthogonal modulation such that no two vectors of the nonorthogonal modulation code produce antipodal signals. The number of vectors can be further expanded from 128 to 1024, producing a new code which is a subset of the linear Reed-Muller code of length 16 and rate 11/16. Removing complements, a subset of this code is produced having a rate of 10/16. The Nordstrom-Robinson code of length 16 can also be generalized to lengths that are even powers of two (e.g. 64, 256) to produce codes known as Kerdock codes.

Relationships between the orthogonal codes and these expanded nonorthogonal codes can be summarized as follows:

$$BO(5, 16) \subset NR(8, 16) \subset RM(11, 16) \subset RM(15, 16)$$

and $$O(4, 16) \subset NR^*(7, 16) \subset RM^*(10, 16) \subset RM^*(14, 16).$$

BO(5,16) represents a biorthogonal code, i.e. an orthogonal code including complementary code words, having a code of length 16 and including $2^5$ codewords, found by taking the 16 vectors $s_1$–$s_{16}$ listed above and adding the negatives of each vector to produce 32 vectors. NR(8,16) code represents the standard Nordstrom-Robinson code of length 16, which includes $2^8$ vectors and produced by taking the 32 vectors from the biorthogonal code BO(5,16) and adding translates corresponding to the eight translation vectors listed above. RM(11,16) represents the Reed-Muller code of length 16 with $2^{11}$ codewords. The RM(15,16) code is the Reed-Muller code of length 16 with $2^{15}$ codewords. As the number of codewords in the code increases, the code distance decreases, i.e., code BO(5,16) has distance 8, code NR(8,16) has distance 6, code RM(11,16) has distance 4, and code RM(15,16) code has distance 2.

Because noncoherent demodulation is preferred, however, subsets of these various codes are preferably used. Half of the codewords are removed from the sets such that no two codewords produce antipodal signals. This reduces the number of codes in the sets and reduces the rate of transmission, but does not change the minimum distance between codewords. Thus, the orthogonal code O(4,16) represents half of the biorthogonal code B(5,16), i.e., the 16 vectors $s_1$–$s_{16}$ listed above. Similarly, the code NR*(7,16) is a subset of the Nordstrom-Robinson code NR(8,16), the RM*(10,16) is a subset of the RM(11,16) code, and the RM*(14,16) code is a subset of the RM(15,16) code.

According to the present invention, the use of a selectively expanded modulation signal set allows the use of a lower rate convolutional code, thus providing greater error protection. For example, replacing the original combination of an orthogonal code set O(4,16) having the rate ¼ and a rate ½ convolutional code, with the nonorthogonal Nordstrom-Robinson code set NR*(7,16) having a rate 7/16 and a lower rate convolutional code with rate 2/7, can be used to produce the same overall code rate of (2/7)*(7/16)=⅛. The squared Euclidean distance associated with the Nordstrom-Robinson code NR*(7,16) is 6*4=24, compared to the squared Euclidean distance 8*4=32 of the original orthogonal code O(4,16). The punctured convolutional code with rate 2/7 and memory 4 has distance 13 compared to the original rate ½ code with distance 7. Thus, assuming sufficient interleaving, the new combination of codes has distance 24*13=312, compared to the old scheme with distance 32*7=224, corresponding to a 1.44 dB gain in additive white Gaussian noise at high signal-to-noise ratio.

Tables 1 and 2 illustrate the effect of expanding the modulation code set and modifying the convolutional code as described above for codes of length 16 and 64, respectively:

TABLE 1

| Modulation Code | | | Convolutional Code | | | Overall | |
|---|---|---|---|---|---|---|---|
| Length | Rate | Distance/4 | Memory | Rate | Distance | Overall Rate | Overall Distance |
| 16 | 4/16 | 8 | 4 | 1/2 | 7 | 1/8 | 56 |
| 16 | 7/16 | 6 | 4 | 2/7 | 13 | 1/8 | 78 |
| 16 | 10/16 | 4 | 4 | 1/5 | 20 | 1/8 | 80 |
| 16 | 14/16 | 2 | 4 | 1/7 | 28 | 1/8 | 56 |
| 16 | 4/16 | 8 | 5 | 1/2 | 8 | 1/8 | 64 |
| 16 | 7/16 | 6 | 5 | 2/7 | 16 | 1/8 | 96 |
| 16 | 10/16 | 4 | 5 | 1/5 | 22 | 1/8 | 88 |
| 16 | 14/16 | 2 | 5 | 1/7 | 32 | 1/8 | 64 |
| 16 | 4/16 | 8 | 6 | 1/2 | 10 | 1/8 | 80 |
| 16 | 7/16 | 6 | 6 | 2/7 | 16 | 1/8 | 96 |
| 16 | 10/16 | 4 | 6 | 1/5 | 25 | 1/8 | 100 |
| 16 | 14/16 | 2 | 6 | 1/7 | 36 | 1/8 | 72 |
| 16 | 4/16 | 8 | 7 | 1/2 | 10 | 1/8 | 80 |
| 16 | 7/16 | 6 | 7 | 2/7 | 19 | 1/8 | 114 |
| 16 | 10/16 | 4 | 7 | 1/5 | 28 | 1/8 | 112 |
| 16 | 14/16 | 2 | 7 | 1/7 | 40 | 1/8 | 80 |

TABLE 2

| Modulation Code | | | Convolutional Code | | | Overall | |
|---|---|---|---|---|---|---|---|
| Length | Rate | Distance/4 | Memory | Rate | Distance | Overall Rate | Overall Distance |
| 64 | 6/64 | 32 | 4 | 1/3 | 12 | 1/32 | 384 |
| 64 | 11/64 | 28 | 4 | 2/11 | 21 | 1/32 | 588 |
| 64 | 6/64 | 32 | 5 | 1/3 | 13 | 1/32 | 416 |
| 64 | 11/64 | 28 | 5 | 2/11 | 24 | 1/32 | 672 |
| 64 | 6/64 | 32 | 6 | 1/3 | 15 | 1/32 | 480 |
| 64 | 11/64 | 28 | 6 | 2/11 | 28 | 1/32 | 784 |
| 64 | 6/64 | 32 | 7 | 1/3 | 16 | 1/32 | 512 |
| 64 | 11/64 | 28 | 7 | 2/11 | 31 | 1/32 | 868 |

For the length 16 modulation vectors shown in Table 1, assuming additive white Gaussian noise, a rate 2/7 convolutional code of memory 7 combined with a (7,16) Nordstrom-Robinson code produces a coding gain of 1.54 dB over orthogonal modulation with a rate ½ convolutional code. For the length 64 modulation vectors shown in Table 2, a rate 2/11 convolutional code of memory 7 combined with a (11, 64) Kerdock code produces a performance gain estimated at 10 $\log_{10}$ (4*868/4*512)=2.3 dB over orthogonal modulation with a rate ⅓ convolutional code.

A demodulator for demodulating the nonorthogonally modulated communications signal can be implemented by augmentation of a receiver used for orthogonally modulated signals. Assuming the preferred noncoherent demodulation, the demodulator processes the received signal by first applying a noncoherent matched filter to each chip of the modulation, and then performing a fast Haddamard transform to obtain decision statistics for the orthogonal vector subset, e.g., $s_1$–$s_{16}$, of the nonorthogonal modulation code. Decision statistics for the other vectors in the modulation code may be obtained by translating the received vector and then performing a fast Haddamard transform to produce decision statistics corresponding to each vector translation. Decision information about a symbol can then be obtained by comparing the decision statistics from each subset.

Implementation

Figure 2:
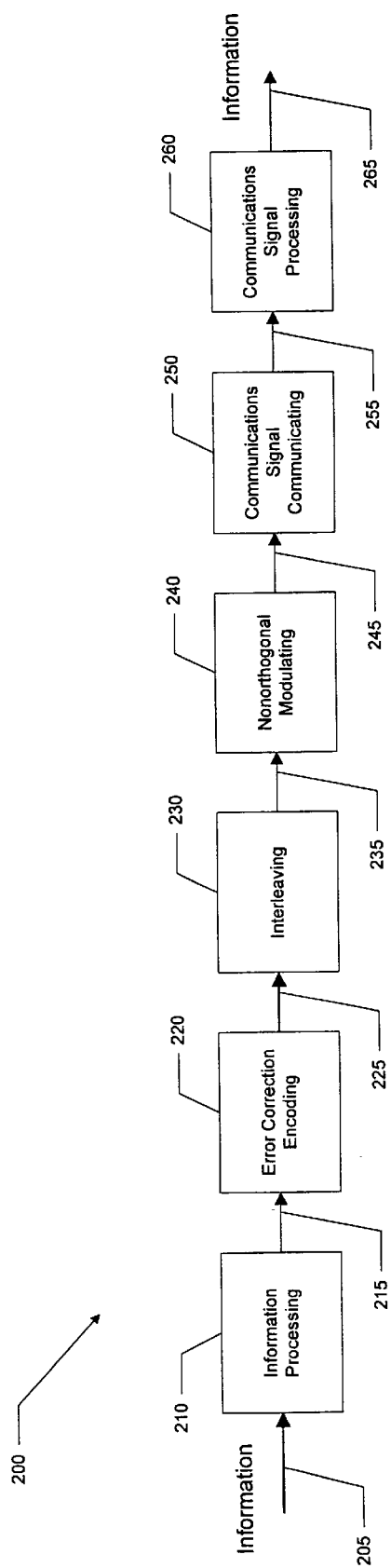
FIG. 2 is a schematic diagram illustrating a communications system according to the present invention.

Referring now to FIG. 2, in a communications system 200 according to the present invention, information 205 is processed by information processing block 210 to produce a plurality of information symbols 215. Error correction encoding block 220 encode the plurality of information symbols 215 according to an error correction code to produce a plurality of error-correction encoded symbols 225. Nonorthogonal modulating block 240 modulate error correction encoded symbols, preferably interleaved error correction encodes symbols 235 interleaved by interleaving block 230, according to a nonorthogonal modulation code to produce a modulated communications signal 245. The modulated communications signal 245 is communicated over a communications medium by communications signal communicating block 250. The communicated modulated communications signal 250 is processed by communications signal processing block 260 to produce information 265.

Figure 3:
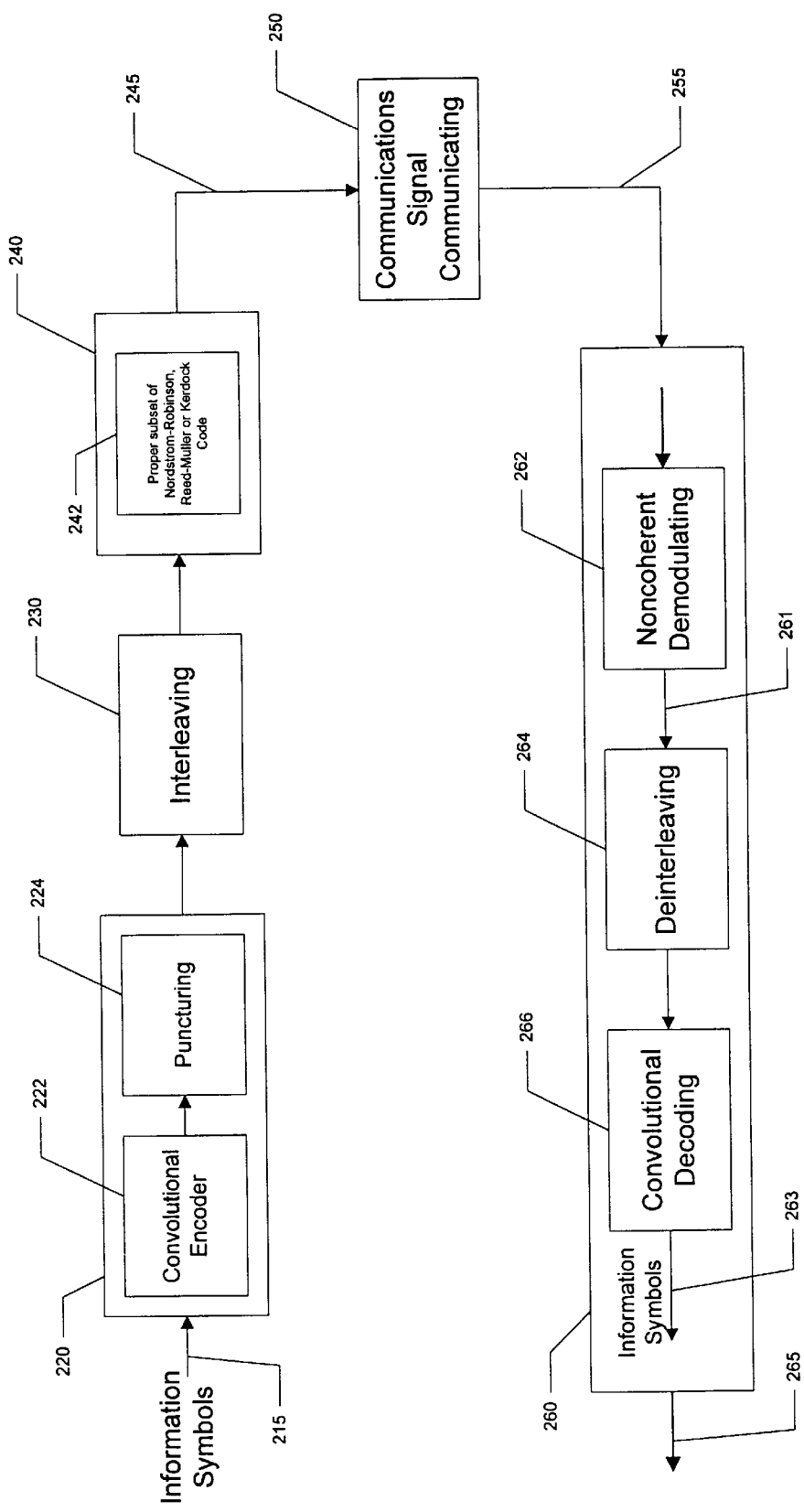
FIG. 3 is a schematic diagram illustrating a preferred embodiment of a communications system according to the present invention.

As illustrated in FIG. 3, the error correction encoding block 220 preferably includes a convolutional encoder 222 which encodes the plurality of information symbols 215 according to a convolutional code, which may in turn may be followed by puncturing block 224, e.g., a puncture table or the like, which punctures the output of the convolutional encoder 222 to produce a desired rate for the error-correction encoding block 220. Those skilled in the art will appreciate, however, that other error correcting codes, such as block codes, may be used with the present invention.

Interleaved error correction encoded symbols 235 produced by interleaving block 230 are modulated in a nonorthogonal modulating block 240, preferably using a nonorthogonal modulation code or signal set 242 which is a proper subset of one of a Nordstrom-Robinson code, a Reed Muller code and a Kerdock code, more preferably a subset which includes only one of each complementary pair of vectors, i.e., vectors which produce antipodal signals. The modulated communications signal 245 thereby produced is then communicated over a communications medium by communications signal communicating block 250. Communications signal processing block 260 preferably includes a noncoherent demodulating block 262 for noncoherently demodulating the communicated modulated communications signal 255 to produce demodulated communications symbols 261. The demodulated communications symbols 261 may then deinterleaved by deinterleaving block 264 and convolutionally decoded in a convolutional decoder 266, for example, a Viterbi algorithm, to produce information symbols 263 which may be further processed to recover information 265.

Those skilled in the art will appreciate that the elements described above may include various communications system components. It will be understood that the information processing block 210, error-correction encoding block 220, interleaving block 230 and nonorthogonal modulating block 240 may include special purpose hardware, software running on general purpose computers or other data processing hardware, or combinations thereof. These elements may be implemented using, for example, commonly-used communications hardware such as amplifiers, multiplexers, gate arrays or other application-specific integrated circuits (ASICs), microprocessors, digital signal processor (DSP) chips and the like, the operation of which is well-known to those skilled in the art and need not be described in greater detail herein. It will also be understood that communications signal communicating block 250 may be implemented using special-purpose hardware, software running on data processors, or combinations thereof, and may include commonly used communications components including but not limited to multiplexers, mixers, amplifiers, antennas, receivers, the operation of which is well-known to those skilled in the art and need not be discussed in greater detail herein. Similarly, communications signal processing block 260 may include special-purpose hardware, software running on data processors or combinations thereof, and may include such commonly-used components including but not limited to amplifiers, filters, analog-to-digital converters (A/D's), ASICs, and DSP chips, the operation of which is well-known to those skilled in the art and need not be discussed in greater detail herein.

Figure 4:
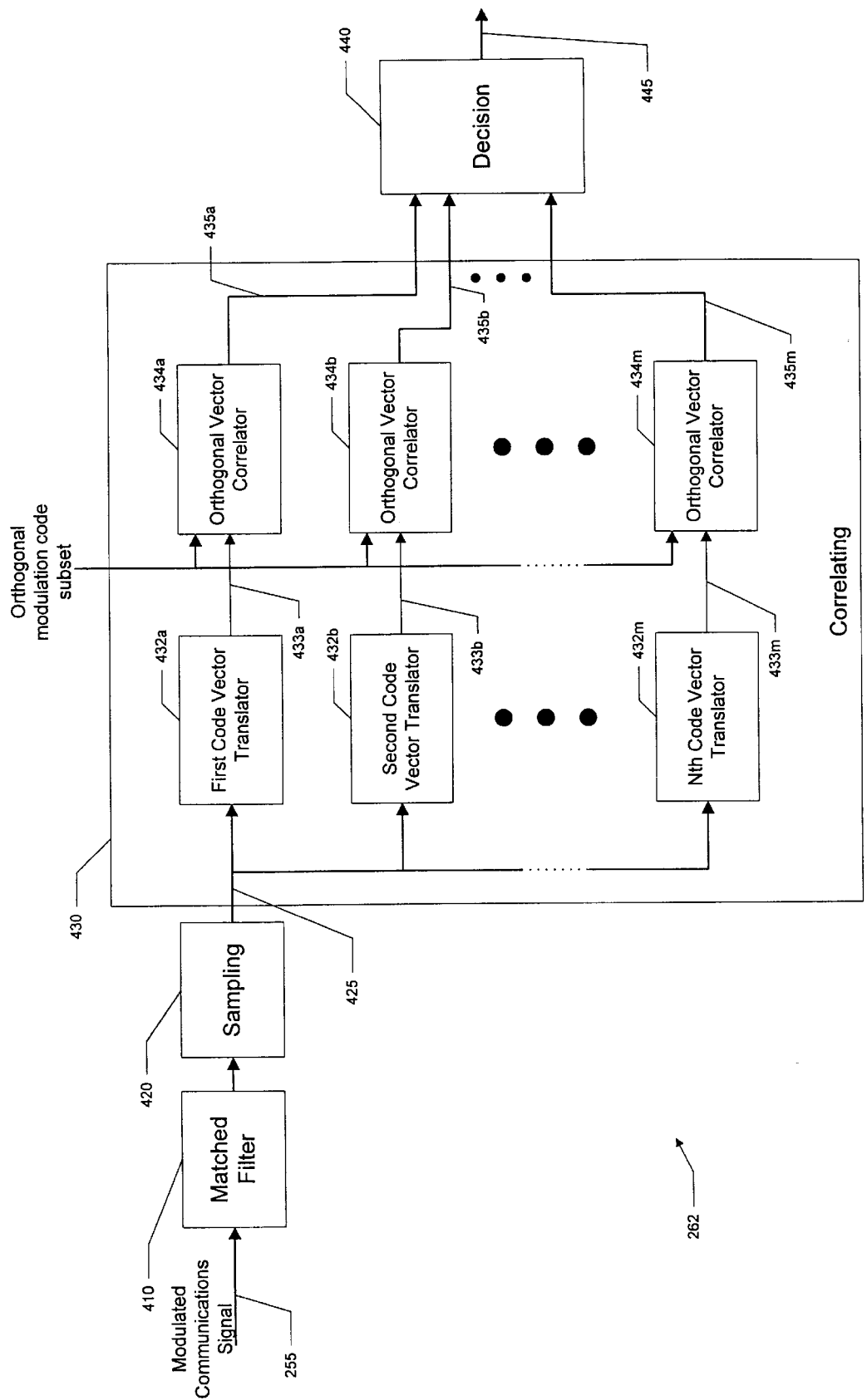
FIG. 4 is a schematic diagram illustrating a preferred embodiment for processing a modulated communications signal according to the present invention.

FIG. 4 illustrates block 262 for noncoherently demodulating a communications signal 255 which is modulated according to the nonorthogonal modulation scheme described above to produce information symbols 445 corresponding to the coded symbols 235 input into the nonorthogonal modulating block 240 of FIGS. 2 and 3. A noncoherent matched filter 410 is applied to the communications signal 255, and the complex output of the matched filter sampled by sampling block 420 to produce a plurality of received communications symbols 425. The received communications symbols 425 are then correlated in correlating block 430 against the vectors of the nonorthogonal modulation code by which the communications signal 255 was modulated, to produce decision information 435a–m representing the degree of correlation of received communications symbols with the code vectors of the nonorthogonal code. The decision information 435a–m is then input into a decision block 440 to produce information symbols 445, representing an estimate of the coded information symbols 235 before modulation in the nonorthogonal modulating block 240 of FIGS. 2 and 3. In this manner, decoding of the communications signal 255 is provided.

The correlating block 430 preferably includes a plurality of code vector translators 420a–m which translate the received communications symbols 435 according to the translation vectors used to produce the nonorthogonal modulation code employed in the nonorthogonal modulating block 240 of FIGS. 2 and 3, as described above. Those skilled in the art will appreciate that because these translation vectors map an orthogonal code to the nonorthogonal code such that the orthogonal code is a subset of the nonorthogonal code, one of the translators 420a–m corresponds to a unity translation and therefore in practice does not require an actual translation. Orthogonal vector correlators 434a–m correlate the translated received communications symbols with the orthogonal subset of the nonorthogonal modulation code to produce the decision information 435a–m, for example, by computing fast Haddamard transforms for each of the translated vector outputs 433a–m using what is commonly referred to as a "Green machine" algorithm, as described in *The Theory of Error-Correcting Codes*, by F. J. MacWilliams et al., North-Holland Publishing Co., 1978, pp. 419–426.

Figure 5:
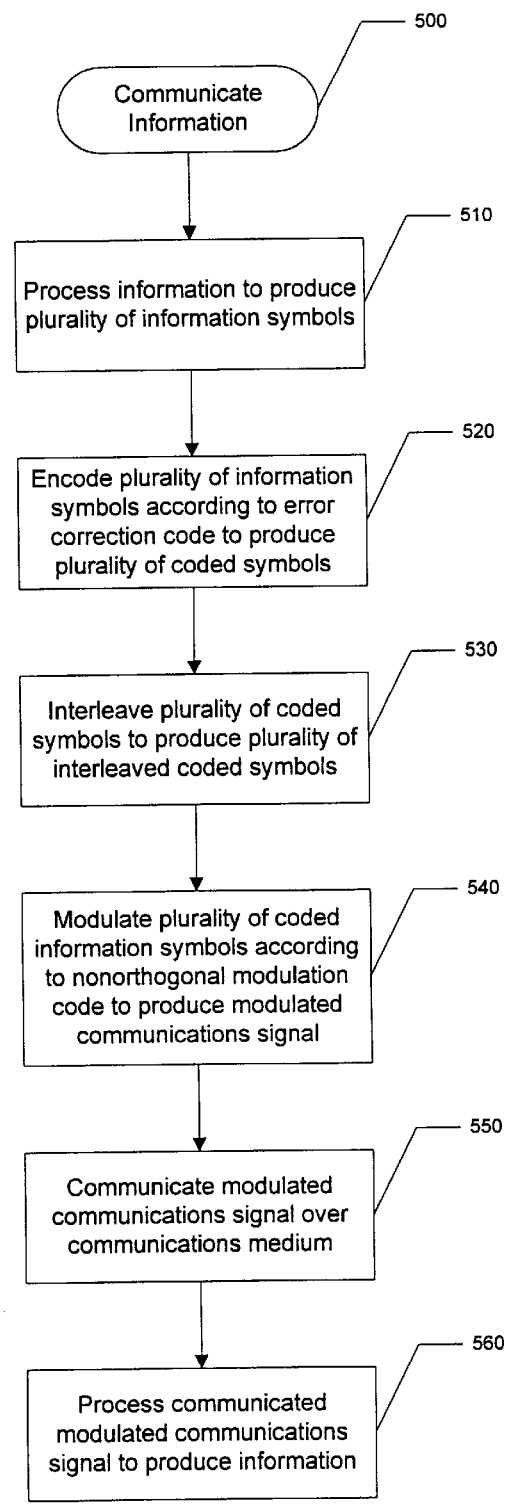
FIG. 5 is a flowchart illustration of operations for communicating information according to the present invention.
Figure 1:
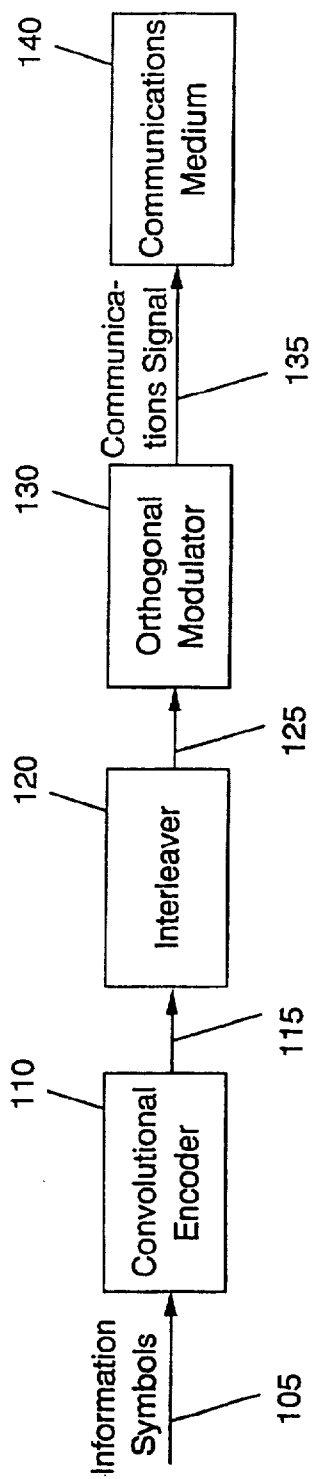
Figure 3:
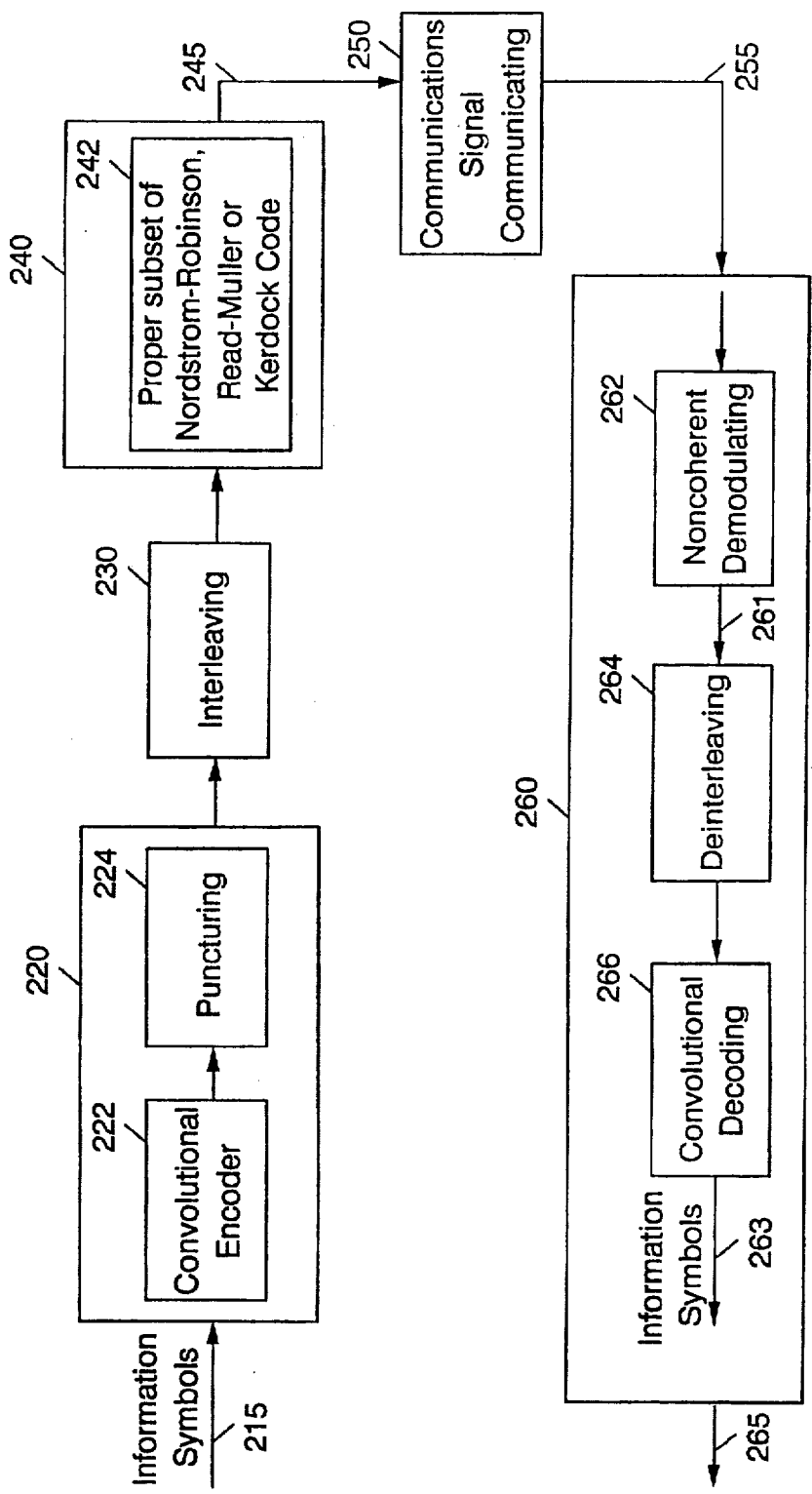
Figure 4:
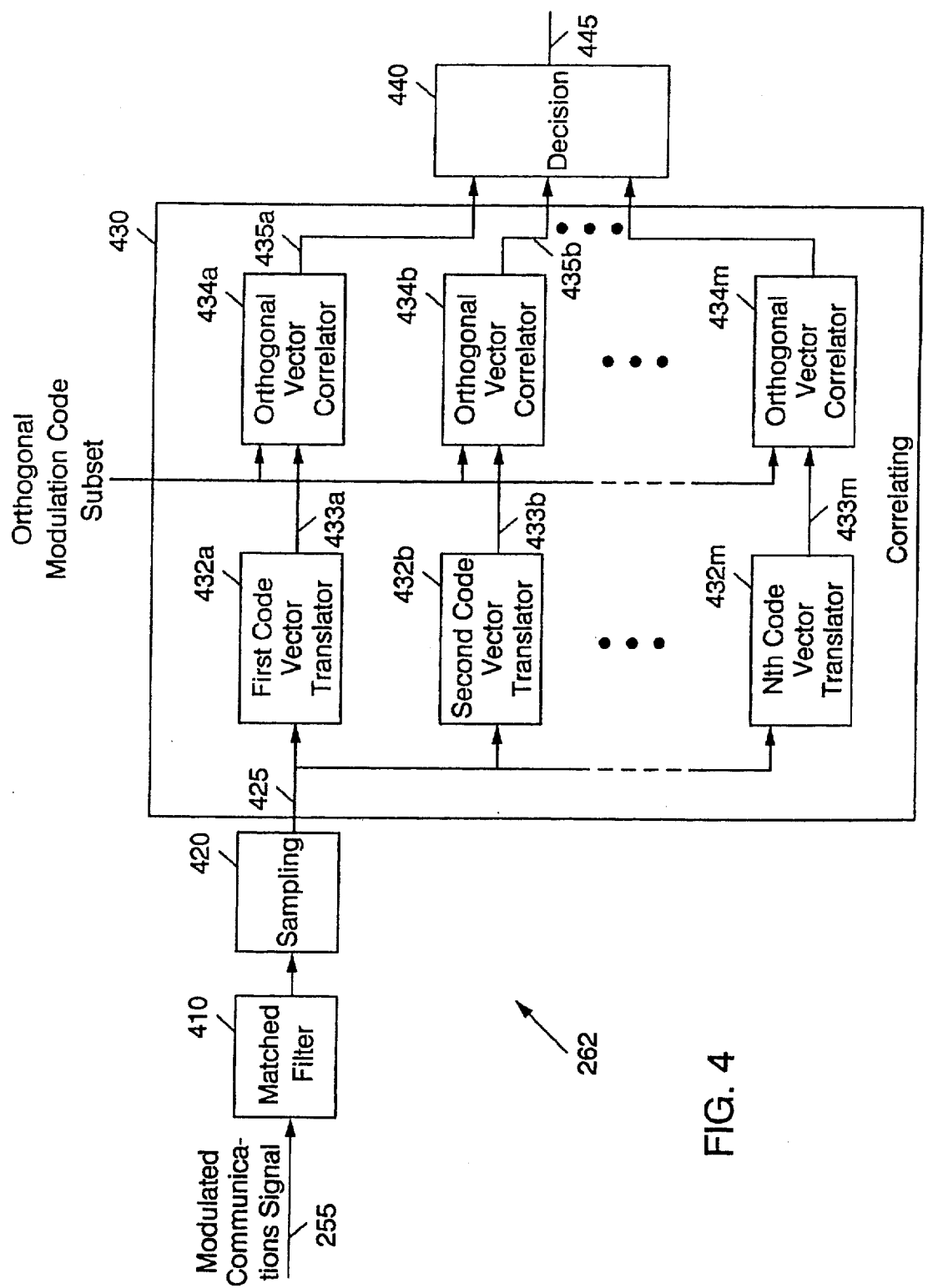
Figure 5:
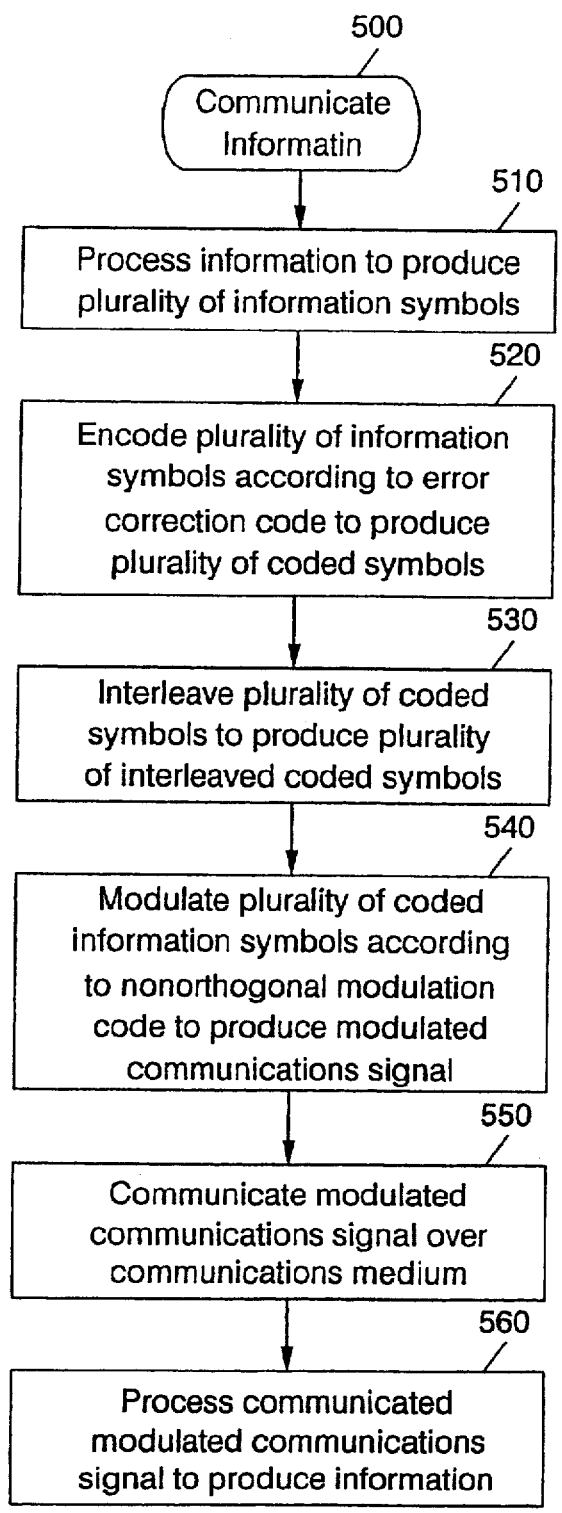

FIG. 5 illustrates operations for communicating information over a communications medium according to the present invention (Block 500). Information is processed to produce a plurality of information symbols (Block 510). The plurality of information symbols are encoded according to an error-correction code, preferably a convolutional code, to produce a plurality of coded symbols (Block 520). The plurality of symbols is then preferably interleaved to produce a plurality of interleaved coded symbols (Block 530). The plurality of interleaved coded symbols are then modulated according to a nonorthogonal modulation code, preferably a proper subset of one of a Nordstrom-Robinson code, a Reed-Muller code or a Kerdock code from which complementary code vectors have been eliminated to allow noncoherent demodulation, to produce a modulated communications signal (Block 540). The modulated communications signal is then communicated over the communications medium (Block 550). The communicated modulated communications signal is then processed, preferably by noncoherent demodulation techniques, to produce information (Block 560), e.g. coded symbol likelihoods. These likelihoods may be deinterleaved and further decoded.

Those skilled in the art will appreciate that variations to the above operations may be performed according to the present invention. For example, it will be understood that although convolutional encoding is preferred for the error correction encoding operation (Block 520), other types of error correction coding, for example, block coding, may be used in lieu convolutional coding. It will also be understood that although the interleaving operation (Block 530) is preferred, the present invention may be performed without interleaving. Similarly, although using a proper subset of one of the aforementioned nonorthogonal codes in which complementary code vectors have been eliminated is preferred in order to enable less complex noncoherent demodulation techniques. It is not required to obtain the benefits of the present invention.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of communicating information over a communications medium, the method comprising the steps of:

processing information to produce a plurality of information symbols;

encoding the plurality of information symbols according to a concatenation of an error correction code and a nonorthogonal modulation code to produce a modulated communications signal;

communicating the modulated communications signal that was produced by encoding the plurality of information symbols according to a concatenation of an error correction code and a nonorthogonal modulation code, over the communications medium; and processing the communicated modulated communications signal that was produced by encoding the plurality of information symbols according to a concatenation of an error correction code and a nonorthogonal modulation code, to produce information.

2. A method according to claim 1, wherein said step of encoding comprises the steps of:

encoding the plurality of information symbols according to the error correction code to produce a plurality of coded symbols; and modulating the plurality of coded symbols according to a nonorthogonal modulation code to produce a modulated communications signal.

3. A method according to claim 2, wherein said step of modulating comprises the step of modulating the plurality of coded symbols according to a nonorthogonal modulation code representing a union of translations of a set of orthogonal code vectors according to a predetermined translation which produces one of a Nordstrom-Robinson code, a Reed-Muller code, or a Kerdock code.

4. A method according to claim 2, wherein said step of modulating comprises the step of modulating the plurality of coded symbols according to one of a Nordstrom-Robinson code, a Reed-Muller code or a Kerdock code.

5. A method according to claim 2:

wherein said step of modulating comprises the step of modulating the plurality of coded symbols according to a proper subset of a nonorthogonal modulation code, the proper subset being operable to produce a modulated communications signal from a signal set such that the communications signal noncoherently demodulates to produce a unique output for each signal in the signal set; and wherein said step of processing the communicated modulated communications signal comprises the step of noncoherently demodulating the communicated modulated communications signal.

6. A method according to claim 5:

wherein said step of modulating comprises the step of modulating the plurality of coded symbols according to a nonorthogonal modulation code representing a union of translations of a set of orthogonal code vectors according to a predetermined set of translation vectors which produces one of a Nordstrom-Robinson code, a Reed-Muller code, or a Kerdock code, the translation including a plurality of translation vectors; and wherein said step of noncoherently demodulating comprises the steps of:

processing the communicated modulated communications signal to produce a plurality of received communications symbols;

translating the plurality of received communications symbols according to the translation vectors to produce a plurality of groups of communications symbols, a respective group corresponding to a respective one of the translation vectors;

correlating each group of communications symbols with the set of orthogonal code vectors to produce decision information for each group; and combining the decision information for the groups of communications symbols to produce a plurality of information symbols.

7. A method according to claim 2, wherein said step of modulating is preceded by the step of interleaving the plurality of coded symbols to produce a plurality of interleaved coded symbols, and wherein said step of modulating comprises the step of modulating the plurality of interleaved coded symbols to produce a modulated communications signal.

8. A method according to claim 1, wherein said step of encoding comprises the step of encoding the plurality of information symbols according to a concatenation of a convolutional code and a nonorthogonal modulation code to produce the modulated communications signal.

9. A method according to claim 8, wherein said step of encoding comprises the step of encoding the plurality of information symbols according to a concatenation of a punctured convolutional code and a nonorthogonal code to produce the modulated communications signal.

10. A method of producing a communications signal representing a plurality of information symbols, the method comprising the steps of:

encoding the plurality of information symbols according to a concatenation of an error correction code and a nonorthogonal modulation code to produce a modulated communications signal.

11. A method according to claim 10, wherein said step of encoding comprises the steps of:

encoding the plurality of information symbols according to the error correction code to produce a plurality of coded symbols; and modulating the plurality of coded symbols according to a nonorthogonal modulation code to produce a modulated communications signal.

12. A method according to claim 11, wherein said step of modulating comprises the step of modulating the plurality of coded symbols according to a nonorthogonal modulation code representing a translation of a set of orthogonal code vectors according to a predetermined translation which produces one of a Nordstrom-Robinson code, a Reed-Muller code, or a Kerdock code.

13. A method according to claim 11, wherein said step of modulating comprises the step of modulating the plurality of coded symbols according to one of a Nordstrom-Robinson code, a Reed-Muller code, or a Kerdock code.

14. A method according to claim 11, wherein said step of modulating comprises the step of modulating the plurality of coded symbols according to a proper subset of a nonorthogonal modulation code, the proper subset being operable to produce a modulated communications signal from a signal set such that the communications signal noncoherently demodulates to produce a unique output for each signal in the signal set.

15. A method according to claim 11, wherein said step of modulating is preceded by the step of interleaving the plurality of coded symbols to produce a plurality of interleaved coded symbols, and wherein said step of modulating comprises the step of modulating the plurality of interleaved coded symbols to produce a modulated communications signal.

16. A method according to claim 10, wherein said step of encoding comprises the step of encoding the plurality of information symbols according to a concatenation of a convolutional code and a nonorthogonal modulation code to produce the modulated communications signal.

17. A method according to claim 16, wherein said step of encoding comprises the step of encoding the plurality of information symbols according to a concatenation of a punctured convolutional code and a nonorthogonal modulation code to produce the modulated communications signal.

18. A system for communicating information over a communications medium, the system comprising:

information processing means for processing information to produce a plurality of information symbols;

means, responsive to said information processing means, for encoding the plurality of information symbols according to a concatenation of an error correction code and a nonorthogonal modulation code to produce a modulated communications signal;

communications signal communicating means, responsive to said means for encoding the plurality of information symbols according to a concatenation of an error correction code and a nonorthogonal modulation code, for communicating the modulated communications signal that was produced by encoding the plurality of information symbols according to a concatenation of an error correction code and a nonorthogonal modulation code, over the communications medium; and communications signal processing means, responsive to said communications signal communicating means, for processing the communicated modulated communications signal that was produced by encoding the plurality of information symbols according to a concatenation of an error correction code and a nonorthogonal modulation code, to produce information.

19. A system according to claim 18, wherein said means for encoding the plurality of information symbols according to a concatenation of an error correction code and a nonorthogonal modulation code comprises:

error correction encoding means, responsive to said information processing means, for encoding the plurality of information symbols according to the error correction code to produce a plurality of coded symbols; and nonorthogonal modulating means, responsive to said error correction encoding means, for modulating the plurality of coded symbols according to a nonorthogonal modulation code to produce a modulated communications signal.

20. A system according to claim 19, wherein said nonorthogonal modulating means comprises means for modulating the plurality of coded symbols according to a nonorthogonal modulation code representing a translation of a set of orthogonal code vectors according to a predetermined translation which produces one of a Nordstrom-Robinson code, a Reed-Muller code, or a Kerdock code.

21. A system according to claim 19, wherein said nonorthogonal modulating means comprises means for modulating the plurality of coded symbols according to one of a Nordstrom-Robinson code, a Reed-Muller code, or a Kerdock code.

22. A system according to claim 19:
wherein said nonorthogonal modulating means comprises means for modulating the plurality of coded symbols according to a proper subset of a nonorthogonal modulation code, the proper subset being operable to produce a modulated communications signal from a signal set such that the communications signal noncoherently demodulates to produce a unique output for each signal in the signal set; and wherein said communications signal processing means comprises noncoherent demodulating means for noncoherently demodulating the communicated modulated communications signal.

23. A system according to claim 22:
wherein said nonorthogonal modulating means comprises means for modulating the plurality of coded symbols according to a nonorthogonal modulation code representing a union of translations of a set of orthogonal code vectors according to a predetermined set of translation vectors which produces one of a Nordstrom-Robinson code, a Reed-Muller code, or a Kerdock code, the translation including a plurality of translation vectors; and wherein said noncoherent demodulating means comprises:
means for processing the communicated modulated communications signal to produce a plurality of received communications symbols;
means, responsive to said means for processing the communicated modulated communications signal to produce a plurality of received communications symbols, for translating the plurality of received communications symbols according the translation vectors to produce a plurality of groups of communications symbols, a respective group corresponding to a respective one of the translation vectors;
means, responsive to said means for translating, for correlating each group of communications symbols with the set of orthogonal code vectors to produce decision information for each group; and
means, responsive to said means for correlating, for combining the decision information for the groups of communications symbols to produce a plurality of information symbols.

24. A system according to claim 19, further comprising interleaving means, responsive to said error correction encoding means, for interleaving the plurality of coded symbols to produce a plurality of interleaved coded symbols, and wherein said nonorthogonal modulating means comprises means for modulating the plurality of interleaved coded symbols to produce a modulated communications signal.

25. A system according to claim 18, wherein said means for encoding the plurality of information symbols according to a concatenation of an error correction code and a nonorthogonal modulation code comprises means for encoding the plurality of information symbols according to a concatenation of a convolutional code and a nonorthogonal modulation code to produce the modulated communications signal.

26. A system according to claim 25, wherein said means for encoding the plurality of information symbols according to a concatenation of an error correction code and a nonorthogonal modulation code comprises means for encoding the plurality of information symbols according to a concatenation of a punctured convolutional code and a nonorthogonal modulation code to produce the modulated communications signal.

27. An apparatus for producing a communications signal representing a plurality of information symbols, the apparatus comprising:
means for encoding the plurality of information symbols according to a concatenation of an error correction code and a nonorthogonal modulation code to produce a modulated communications signal.

28. An apparatus according to claim 27, wherein said means for encoding the plurality of information symbols according to a concatenation of an error correction code and a nonorthogonal modulation code comprises:
error correction encoding means, responsive to said information processing means, for encoding the plurality of information symbols according to the error correction code to produce a plurality of coded symbols; and
nonorthogonal modulating means, responsive to said error correction encoding means, for modulating the plurality of coded symbols according to a nonorthogonal modulation code to produce a modulated communications signal.

29. An apparatus according to claim 28, wherein said nonorthogonal modulating means comprises means for modulating the plurality of coded symbols according to a nonorthogonal modulation code representing a translation of a set of orthogonal code vectors according to a predetermined translation which produces one of a Nordstrom-Robinson code, a Reed-Muller code, or a Kerdock code.

30. An apparatus according to claim 28, wherein said nonorthogonal modulating means comprises means for modulating the plurality of coded symbols according to one of a Nordstrom-Robinson code, a Reed-Muller code, or a Kerdock code.

31. An apparatus according to claim 28, wherein said nonorthogonal modulating means comprises means for modulating the plurality of coded symbols according to a proper subset of a nonorthogonal modulation code, the proper subset being operable to produce a modulated communications signal from a signal set such that the communications signal noncoherently demodulates to produce a unique output for each signal in the signal set.

32. A system according to claim 28, further comprising interleaving means, responsive to said error correction encoding means, for interleaving the plurality of coded symbols to produce a plurality of interleaved coded symbols, and wherein said nonorthogonal modulating means comprises means for modulating the plurality of interleaved coded symbols to produce a modulated communications signal.

33. An apparatus according to claim 27, wherein said means for encoding the plurality of information symbols according to a concatenation of an error correction code and a nonorthogonal modulation code comprises means for encoding the plurality of information symbols according to a concatenation of a convolutional code and a nonorthogonal modulation code to produce the modulated communications signal.

34. An apparatus according to claim 33, wherein said means for encoding the plurality of information symbols according to a concatenation of a convolutional code and a nonorthogonal modulation code comprises means for encoding the plurality of information symbols according to a concatenation of a punctured convolutional code and a nonorthogonal modulation code to produce the modulated communications signal.

* * * * *

UNITED STATES PATENT AND TRADEMARK OFFICE
CERTIFICATE OF CORRECTION

PATENT : 5,938,787

DATED : August 17, 1999

INVENTOR(S) : Wayne e. Stark

It is certified that error appears in the above-identified patent and that said Letters Patent is hereby corrected as shown below:

On the Cover Page:

[57] Abstract, Line 7, please delete "process".

The title page showing the illustrative figure should be deleted and substitute therefore the attached title page.

In the Drawings:
Sheets 1-5, consisting of Figs. 1-5, should be deleted to be replaced with the corrected drawing sheets 1-5, consisting of Figs. 1-5, as shown on the attached pages.

Signed and Sealed this

Ninth Day of May, 2000

Attest:

Q. TODD DICKINSON

*Attesting Officer*  *Director of Patents and Trademarks*

United States Patent [19]

Stark

[11] Patent Number: 5,938,787
[45] Date of Patent: Aug. 17, 1999

[54] COMMUNICATIONS SYSTEMS AND METHODS EMPLOYING CODE RATE PARTITIONING WITH NONORTHOGONAL MODULATION

[75] Inventor: Wayne E. Stark, Chapel Hill, N.C.

[73] Assignee: Ericsson Inc., Research Triangle Park, N.C.

[21] Appl. No.: 08/826,484

[22] Filed: Mar. 27, 1997

[51] Int. Cl.$^6$ .................................................. H03M 13/00
[52] U.S. Cl. ..................... 714/755; 714/746; 714/708; 714/758; 714/750; 714/752; 714/704; 714/754; 714/781; 370/321; 370/326; 370/350; 371/30; 371/5.5; 371/37.7; 371/34.1; 371/37.01; 371/5.1; 371/37.03; 371/37.07; 371/43
[58] Field of Search ............................. 371/37.4, 30, 37.7, 371/34.1, 5.5, 37.01, 5.1, 43, 37.03, 37.07; 370/321, 326, 350

[56] References Cited

U.S. PATENT DOCUMENTS

| | | | |
|---|---|---|---|
| 4,446,530 | 5/1984 | Tsuboka | 364/725 |
| 4,894,844 | 1/1990 | Forney, Jr. | 375/269 |
| 4,939,555 | 7/1990 | Calderbank et al. | 375/286 |
| 5,561,618 | 10/1996 | Dehesh | 364/725.01 |
| 5,577,053 | 11/1996 | Dent | 371/37.4 |
| 5,594,742 | 1/1997 | Hemmati | 371/43.4 |
| 5,659,578 | 8/1997 | Alamouti et al. | 375/261 |

FOREIGN PATENT DOCUMENTS

| | | |
|---|---|---|
| 0 663 775 A2 | 7/1995 | European Pat. Off. |
| WO 95/22859 | 8/1995 | WIPO |
| WO 96/05668 | 2/1996 | WIPO |

OTHER PUBLICATIONS

International Search Report, PCT/US98/05844, Aug. 24, 1998.

Henkel "*Phase–Invariant Coded Phase Shift Keying Using Reed–Muller Codes*", AEU Archiv fur Elektronik und Ubertragungstechnik, vol. 46, No. 3, May 1992, pp. 125–130.

Atkin et al., "Multiple Laser Diodes Non–Orthogonal Poer Combining", IEEE, pp. 113–124, May 1989.

Cheng et al., "*Performance of Trellis Coded Direct–Sequence Spread–Spectrum Multiple–Access With Noncoherent Reception in a Fading Environment*", The Seventh IEEE International Symposium on Personal, Indoor and Mobile Radio Communications, PIMRC '96: Taipei International Convention Center, Taipei, Taiwan, ROC, Oct. 15–18, 1996, pp. 1125–1130.

MacWilliams et al. "*The Theory of Error–Correcting Codes*", North–Holland Publishing Company, 1977, pp. 73–78, 406–479.

*Primary Examiner*—Reba I. Elmore
*Assistant Examiner*—McDieunel Marc
*Attorney, Agent, or Firm*—Myers Bigel Sibley & Sajovec

[57] ABSTRACT

Information is processed to produce a plurality of information symbols. The plurality of information symbols are encoded according to a concatenation of an error correction code and a nonorthogonal modulation code to produce a modulated communications signal. The modulated communications signal is communicated over a communications medium, and process the communicated modulated communications signal is processed to produce information. Preferably, the information symbols are encoded according to an error correction code, preferably a convolutional code, to produce a plurality of coded symbols. The plurality of coded symbols are preferably interleaved to produce a plurality of interleaved coded symbols. The interleaved coded symbols are then modulated according to a nonorthogonal code to produce the modulated communications signal. Preferably, the coded symbols are modulated according to a proper subset of a one of a Nordstrom-Robinson code, a Reed-Muller code, or a Kerdock code, the proper subset being operable to produce a modulated communications signal from a signal set such that the communications signal noncoherently demodulates to produce a unique output for each signal in the signal set, and the communications signal processing includes noncoherent demodulating to noncoherently demodulate the communicated modulated communications signal.

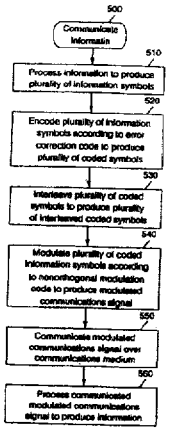

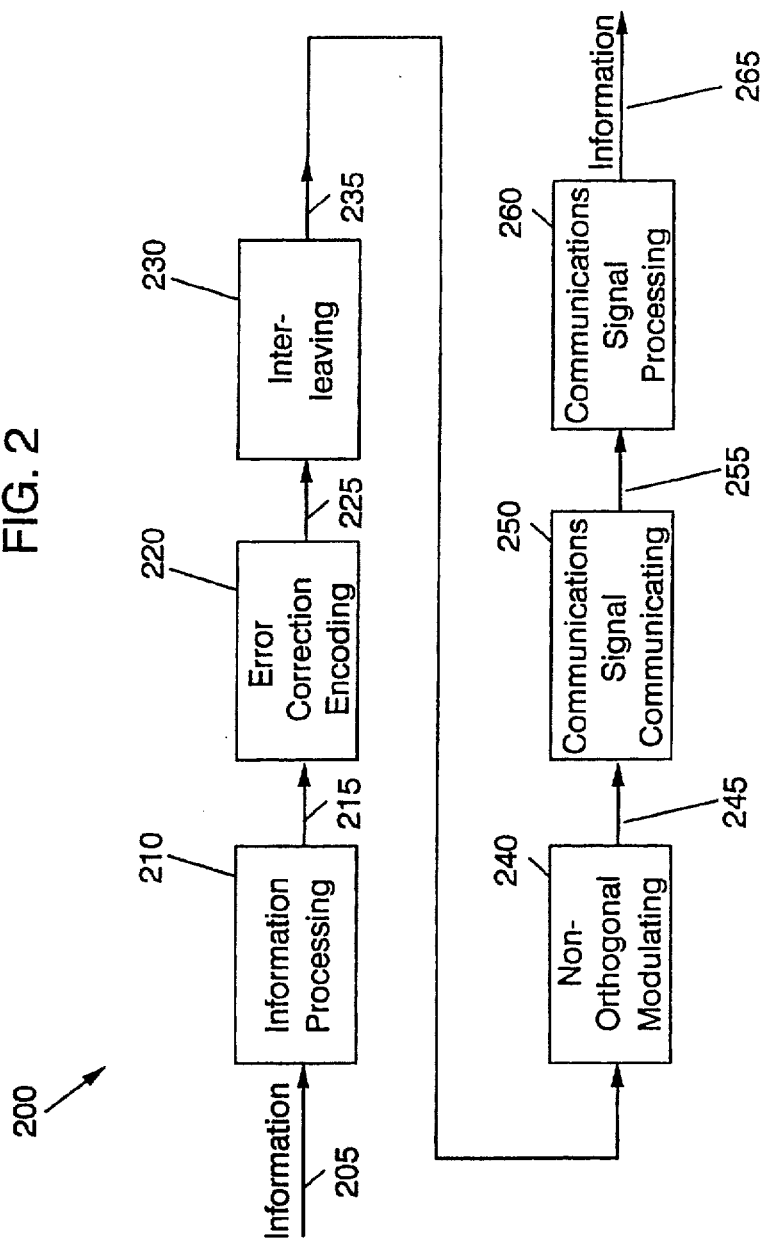

34 Claims, 5 Drawing Sheets